United States Patent
Sano

(10) Patent No.: US 9,893,113 B2
(45) Date of Patent: Feb. 13, 2018

(54) RADIATION DETECTION APPARATUS AND RADIATION IMAGING SYSTEM

(71) Applicant: CANON KABUSHIKI KAISHA, Tokyo (JP)

(72) Inventor: Yasuhiko Sano, Sagamihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 21 days.

(21) Appl. No.: 14/956,488

(22) Filed: Dec. 2, 2015

(65) Prior Publication Data

US 2016/0178758 A1    Jun. 23, 2016

(30) Foreign Application Priority Data

Dec. 22, 2014  (JP) ................................ 2014-259270
Sep. 2, 2015   (JP) ................................ 2015-173201

(51) Int. Cl.
*G01J 1/42*     (2006.01)
*H01L 27/146*   (2006.01)
(Continued)

(52) U.S. Cl.
CPC ......... *H01L 27/14658* (2013.01); *H04N 5/32* (2013.01); *H04N 5/3577* (2013.01); *H04N 5/3698* (2013.01)

(58) Field of Classification Search
CPC .... G01J 9/00; G01J 1/4228; G01J 3/02; G01J 3/2803; G01J 3/36
See application file for complete search history.

(56) References Cited

U.S. PATENT DOCUMENTS

| 5,811,790 A  | 9/1998 | Endo et al. ................ 250/208.1 |
| 7,391,845 B2 | 6/2008 | Konno ............................ 378/19 |

(Continued)

FOREIGN PATENT DOCUMENTS

| JP | 2004-226313 | 8/2004 |
| JP | 4018725     | 12/2007 |

(Continued)

OTHER PUBLICATIONS

Extended European Search Report dated Mar. 4, 2016 in counterpart application 15194996.3 (in English).

(Continued)

*Primary Examiner* — David Porta
*Assistant Examiner* — Mamadou Faye
(74) *Attorney, Agent, or Firm* — Fitzpatrick Cella Harper and Scinto

(57) ABSTRACT

A radiation detection apparatus includes a planar detection unit which has a two-dimensional array of elements which obtain electrical signals based on radiation, and detects radiation upon irradiation, a driving circuit which drives switches for causing the elements to output the electrical signals, an obtaining circuit which obtains the electrical signals from the elements in accordance with the switches being driven, a support base on which the driving circuit and the obtaining circuit are arranged, and a conductive member having a part which is arranged in front of the detection unit when viewed from a radiation source which performs irradiation with radiation used for imaging and is electrically connected to ground of the driving circuit and ground of the obtaining circuit.

11 Claims, 3 Drawing Sheets

(51) Int. Cl.
   *H04N 5/32*   (2006.01)
   *H04N 5/357*  (2011.01)
   *H04N 5/369*  (2011.01)

(56) References Cited

U.S. PATENT DOCUMENTS

| | | |
|---|---|---|
| 8,742,354 B2 | 6/2014 | Shimizukawa et al. ... 250/354.1 |
| 2004/0217294 A1 | 11/2004 | Zur .......... 250/370.09 |
| 2004/0245486 A1 | 12/2004 | Kuranishi .......... 250/591 |
| 2005/0184244 A1* | 8/2005 | Yoshimuta .......... G01T 1/244 |
| | | 250/370.01 |
| 2008/0078938 A1 | 4/2008 | Vafi et al. .......... 250/370.09 |
| 2010/0193691 A1* | 8/2010 | Ishii .......... H01L 27/14663 |
| | | 250/366 |
| 2010/0194947 A1* | 8/2010 | Ogura .......... H04N 5/3595 |
| | | 348/301 |
| 2012/0126126 A1* | 5/2012 | Yokoyama .......... G01T 1/2928 |
| | | 250/366 |
| 2014/0042331 A1* | 2/2014 | Konkle .......... G01T 1/2018 |
| | | 250/369 |

FOREIGN PATENT DOCUMENTS

| | | |
|---|---|---|
| JP | 2012-112726 | 6/2012 |
| JP | 2012-119770 | 6/2012 |

OTHER PUBLICATIONS

Singapore Search Report dated Mar. 28, 2016 in counterpart application 10201509711P (in English).

* cited by examiner

RADIATION DETECTION APPARATUS AND RADIATION IMAGING SYSTEM

BACKGROUND OF THE INVENTION

Field of the Invention

The present invention relates to a radiation detection apparatus which detects radiation and a radiation imaging system which obtains a radiation image by using the radiation detection apparatus.

Description of the Related Art

Recently, a flat panel type radiation detection apparatus has been popularized, which uses a sensor array having conversion elements, each designed to convert radiation into an electrical signal, arranged in a two-dimensional array. Such a sensor array generally includes a conversion element formed on a glass substrate for each pixel and a switch element such as a TFT which transfers an electrical signal converted by the conversion element to the outside. These elements are two-dimensionally arranged in an array. Japanese Patent. No. 4018725 discloses a technique of obtaining an image by using such a sensor array. According to this technique, a plurality of gate drivers are arranged outside or on a glass substrate to drive switch elements via driving signal lines. In addition, like the gate drivers, a plurality of sense amplifiers for charge detection are arranged outside or on the glass substrate to detect electrical signals extracted via image signal lines. An image is then formed from these detected electrical signals.

Such a radiation detection apparatus has the following problems because conversion elements detect slight charges. For example, an imaging room in a hospital or the like is equipped with an apparatus for emitting radiation, another diagnostic apparatus, or the like together with a radiation detection apparatus. These apparatuses sometimes use high power. That is, there can be an environment where an apparatus which detects slight charges and an apparatus which uses high power coexist. In such an environment, unwanted electromagnetic energy from a high power apparatus becomes magnetic field noise to other apparatuses. This sometimes causes malfunction or performance deterioration in these apparatuses. When alternating current magnetic field noise is externally applied to the radiation detection apparatus, image noise in a horizontal stripe pattern called line artifacts appear in an obtained image. Such noise is generated from high power equipment, the inverter of an X-ray generator, and the like, in particular, and has a frequency band ranging from about 1 kHz to about 100 kHz. In addition, such alternating current magnetic field noise can arrive from various directions depending on the installed or used states of a radiation detection apparatus and high power equipment. It is generally difficult to take anti-noise measures against such alternating current magnetic field noise.

Conventionally, various techniques for reducing image noise caused by such an alternating current magnetic field have been proposed. Japanese Patent Laid-Open No. 2012-119770 has disclosed a technique of eliminating, from a final image, the influence of an externally arriving alternating current magnetic field with a specific frequency and a specific amplitude by subtraction processing by adjusting readout times for a dark image and a radiation image. In addition, Japanese Patent Laid-Open No. 2012-112726 has disclosed a technique of reducing the influence of electromagnetic noise by arranging a conductive member, a photoelectric conversion unit, and a scintillator in the order named from a side of a radiation detection apparatus which is irradiated with radiation.

The technique disclosed in Japanese Patent Laid-Open No. 2012-119770, however, cannot eliminate image noise by subtraction processing when the frequency or amplitude of an alternating current magnetic field changes at the time of obtaining a dark image and at the time of obtaining a radiation image. In addition, in order to make the time from the start of obtaining a dark image to the start of obtaining a radiation image become an integer multiple of an external magnetic field cycle, it is necessary to delay an image obtaining interval in accordance with the external magnetic field cycle, resulting in a decrease in imaging speed. Furthermore, although the technique disclosed in Japanese Patent Laid-Open No. 2012-112726 can reduce electromagnetic noise from a radiation incident direction, it is difficult to obtain an effect with respect to an alternating current magnetic field arriving from the horizontal direction at the radiation detection apparatus.

The present invention reduces image noise caused by an alternating current magnetic field arriving from the horizontal direction with an unknown frequency and amplitude in a radiation detection apparatus.

SUMMARY OF THE INVENTION

According to one aspect of the present invention, there is provided a radiation detection apparatus comprising: a planar detection unit, having a two-dimensional array of elements which obtain electrical signals based on radiation, configured to detect radiation upon irradiation; a driving circuit which drives switches for causing the elements to output the electrical signals; an obtaining circuit which obtains the electrical signals from the elements in accordance with the switches being driven; a support base on which the driving circuit and the obtaining circuit are arranged; and a conductive member having a part which is arranged near a front of the detection unit when viewed from a radiation source which performs irradiation with radiation and is electrically connected to ground of the driving circuit and ground of the obtaining circuit.

According to another aspect of the present invention, there is provided a radiation imaging system comprising: a radiation detection apparatus; an irradiation unit configured to irradiate the radiation detection apparatus with radiation; and a forming unit configured to form a radiographic image, the radiation detection apparatus including a planar detection unit, having a two-dimensional array of elements which obtain electrical signals based on radiation, configured to detect radiation upon irradiation, a driving circuit which drives switches for causing the elements to output the electrical signals, an obtaining circuit which obtains the electrical signals from the elements in accordance with the switches being driven, a support base on which the driving circuit and the obtaining circuit are arranged, and a conductive member having a part which is arranged near a front of the detection unit when viewed from a radiation source which performs irradiation with radiation and is electrically connected to ground of the driving circuit and ground of the obtaining circuit, and the forming unit forming the radiographic image based on the electrical signals obtained by the obtaining circuit.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

An exemplary embodiment(s) of the present invention will now be described in detail with reference to the drawings. It should be noted that the relative arrangement of the components, the numerical expressions and numerical values set forth in these embodiments do not limit the scope of the present invention unless it is specifically stated otherwise.

A radiation detection apparatus according to the present invention is used, for example, in a radiation imaging system which includes a radiation source which emits radiation and forms a radiographic image from an electrical signal corresponding to a radiation detection result output from the radiation detection apparatus which has detected the emitted radiation. Note that the radiation imaging system may be a single apparatus including all the above radiation source and the radiographic image forming function or at least part of the system may exist as a discrete and independent apparatus. In addition, radiation may be X-rays or another type of radiation.

First Embodiment

Figure 1A:
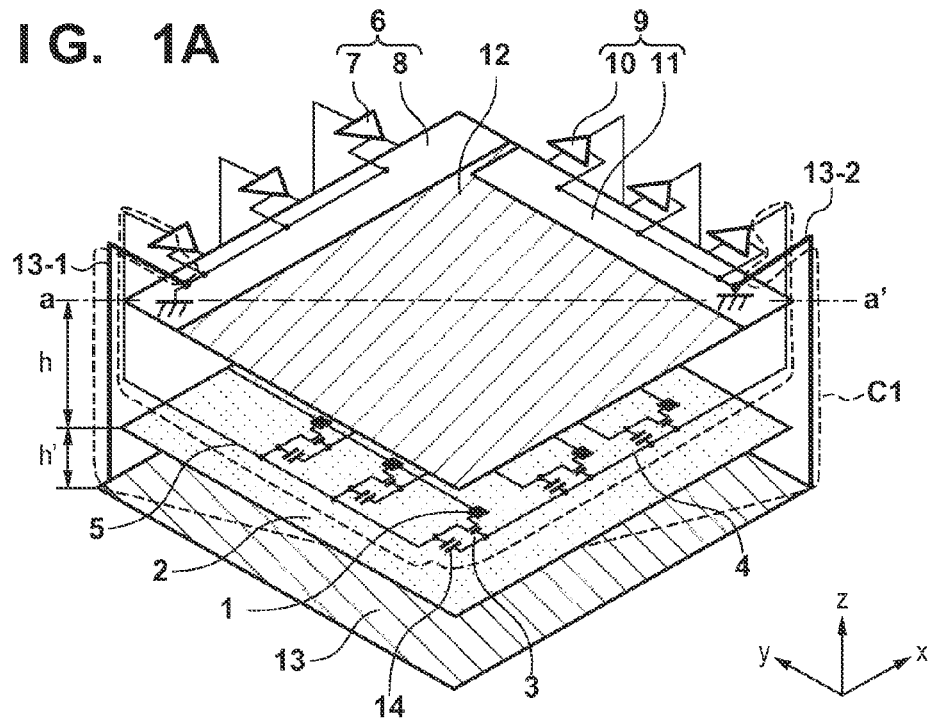
FIGS. 1A and 1B are views showing the first example of the structure of a radiation detection apparatus.
Figure 1B:
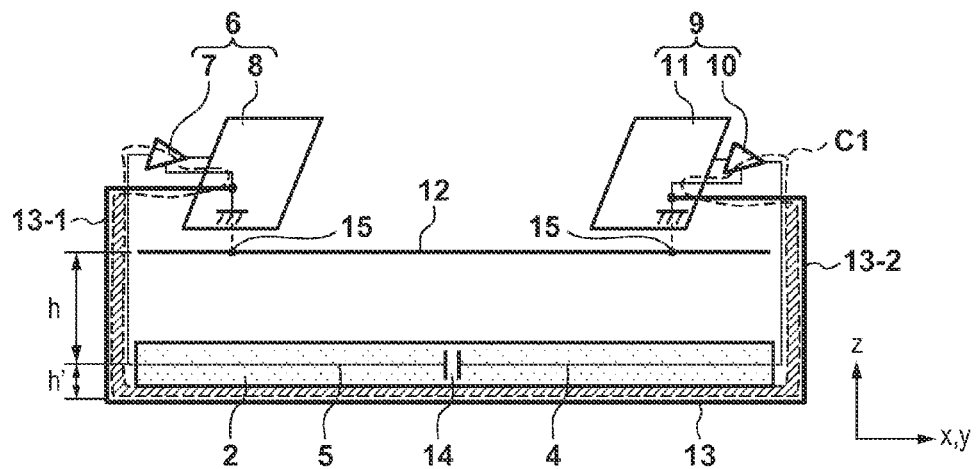

FIGS. 1A and 1B show the first example of the structure of the radiation detection apparatus. FIG. 1A is a perspective view of the radiation detection apparatus. FIG. 1B is a sectional view taken along a-a' in FIG. 1A. Note that, referring to FIGS. 1A and 1B, the single-headed arrows respectively designate three-dimensional coordinates as X-, Y-, and Z-axes, and the apparatus is irradiated with radiation from below in FIGS. 1A and 1B, that is, from the origin side of the Z-axis. In addition, an alternating current magnetic field as a noise source arriving from the Z direction will be referred to as a vertical alternating current magnetic field, and an alternating current magnetic field as a noise source arriving from the X or Y direction will be referred to as a horizontal alternating current magnetic field.

The radiation detection apparatus is formed by stacking a conductive member 13, a sensor array 2, and a support base 12 when, for example, viewed from the direction in which the apparatus is irradiated with radiation.

The sensor array 2 is a planar radiation detection unit which is formed from a substrate having an insulating surface, such as a glass substrate, and has a plurality of conversion elements 1 and switch elements 3, each corresponding to one pixel, arranged two-dimensionally. The sensor array 2 is wired with driving signal lines 4 for driving the switch elements 3 and image signal lines 5 for outputting radiation detection results obtained by the conversion elements 1. Note that parasitic capacitors 14 can exist as electrostatic capacitors unintentionally formed in the sensor array 2, which are derived from the structure of each switch element 3 and the intersections between the driving signal lines 4 and the image signal lines 5.

Each conversion element 1 is an element which converts radiation into an electrical signal. Each switch element 3 is formed from a TFT or the like. As described above, each of the pairs of the conversion elements 1 and the switch elements 3 corresponds to one pixel. These pairs are two-dimensionally arranged in an array on the sensor array 2. The resultant structure functions as a radiation detection unit for obtaining a radiographic image constituted by a plurality of pixels. The driving signal lines 4 are arranged in correspondence with the respective rows of the two-dimensional array on which the pairs of the conversion elements 1 and the switch elements 3 are arranged, and supply either a driving on-bias or a driving off-bias to the switch elements 3 on each row. Note that a driving off-bias is required to be at least a potential which can turn off each switch element 3, and is the same potential as ground. The image signal lines 5 are arranged in correspondence with the respective columns of the above two-dimensional array, and transmit, to readout circuits 6, electrical signals, that is, radiation detection results, from the conversion elements 1 corresponding to the switch elements 3 to which driving on-biases are supplied from the driving signal lines 4. Note that each conversion element 1 may be either of a direct conversion type which directly converts radiation into an electrical signal or of an indirect conversion type which converts light emitted from a phosphor (not shown) in accordance with irradiation with radiation into an electrical signal.

The readout circuits 6 and output circuits 9 are arranged on the support base 12. The support base 12 is a base for fixing and supporting the sensor array 2, the readout circuits 6, and the output circuits 9. As the support base 12, there is used, for example, a base formed by sandwiching a metal mesh with a conductive metal material or lightweight, high-strength carbon fiber reinforced plastic (CFRP) material, responding to a recent request for weight reduction, or a CFRP material alone. Note that the support base 12 is arranged at an interval h from the driving signal lines 4 and the image signal lines 5 in a radiation irradiation direction, that is, in a plane facing the Z direction, through a member for shock buffering and a shielding member for shielding various types of circuits against radiation.

Each readout circuit 6 includes a sense amplifier 7 and a readout substrate 8 and functions as an obtaining circuit for obtaining a radiation detection result. Each sense amplifier 7 converts an electrical signal from the corresponding image signal line 5 into a digital signal by using an A/D converter or the like and transmits the signal to the readout substrate 8. The readout substrate 8, for example, inputs/outputs control signals to/from each sense amplifier 7, and sometimes supplies power.

Each output circuit 9 includes a gate driver 10 and an output substrate 11, and functions as a driving circuit which drives each of the switch elements 3 described above. Each gate driver 10 selectively applies either a driving on-bias for turning on the corresponding switch element 3 or a driving off-bias for turning off the switch element 3 to the corresponding driving signal line 4. Both a driving on-bias and a driving off-bias can be input to each gate driver 10. The output substrate 11 inputs/outputs control signals to each gate driver 10 and supplies power to it.

The sense amplifiers 7 and the gate drivers 10 are generally formed from integrated circuits, and are mounted on flexible substrates such as TCPs (Tape Carrier Packages) and COFs (Chip On Films). The sense amplifiers 7 and gate drivers 10 may be mounted on the sensor array 2 by a mounting scheme called COG (Chip On Glass).

The conductive member 13 is arranged nearer to the radiation irradiation side than the sensor array 2 and is used for one of purposes including preventing the detection of visible light other than radiation, protecting a phosphor (not shown), and taking anti-electric field noise measures. For the above purpose, the conductive member 13 is generally arranged near to the conversion elements 1, the driving signal lines 4, and the image signal lines 5 at an interval h' from them in the radiation irradiation direction, that is, the Z direction. Note that the conductive member 13 needs to transmit radiation at the time of imaging, and hence is required to have, for example, a thickness that makes the radiation transmittance become 99% or more. The conductive member 13 is, for example, a thin film containing aluminum and covering the sensor array 2. This film has a thickness of, for example, about 0.1 μm to 100 μm. Note that the conductive member 13 is not limited to this, and may be formed from other materials as long as they are conductive materials having a radiation transmittance of 99% or more, or may have a thickness outside the above range.

In addition, in this embodiment, as will be described later, the conductive member 13 is also used as part of a closed loop which receives alternating current magnetic field noise, that is, part of a propagation path for inductive currents. For this reason, portions 13-1 and 13-2 of the conductive member 13 are electrically connected to ground of the readout circuit 6 and ground of the output circuit 9, respectively.

Connecting points 15 are used for connections for making ground of the readout circuit 6 and ground of the output circuit 9 conductive to the support base 12. As the connecting points 15, conductive screws or the like are used. In this embodiment, for example, at least one of ground of the readout circuit 6 and ground of the output circuit 9 may not be made conductive to the support base 12, that is, may not be electrically connected to it.

Figure 2A:
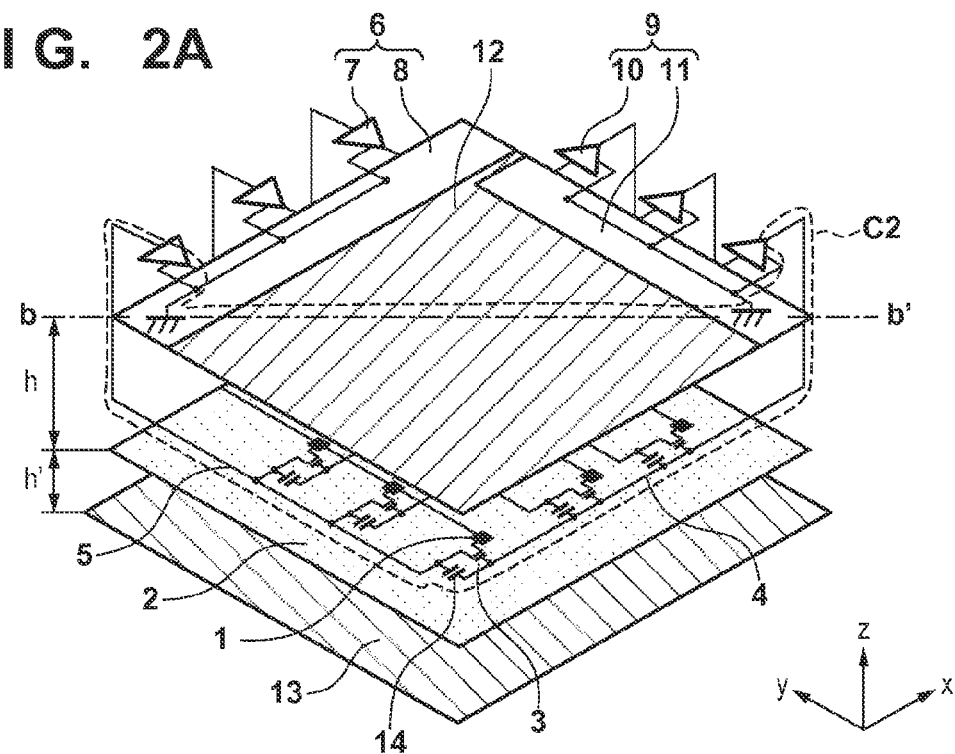
FIGS. 2A and 2B are views showing an example of the structure of the radiation detection apparatus when a conductive member is not connected to the radiation detection apparatus in FIGS. 1A and 1B.
Figure 2B:
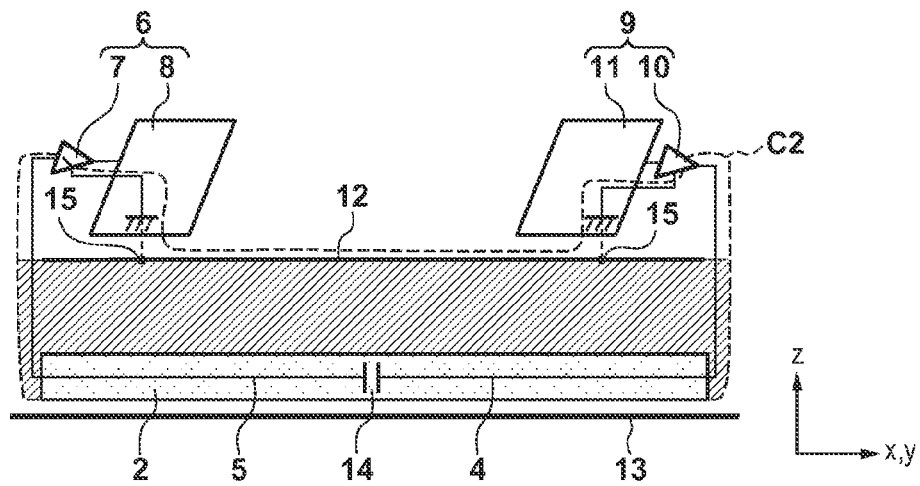

The operation principle of the radiation detection apparatus according to this embodiment will be described below. FIGS. 2A and 2B show the arrangement of a radiation detection apparatus as a comparative example, which is obtained by omitting the portions 13-1 and 13-2, which are portions for electrically connecting the conductive member 13 to ground of the readout circuit 6 and ground of the output circuit 9, from the radiation detection apparatus in FIGS. 1A and 1B. FIG. 2A is a perspective view of the comparative example of the radiation detection apparatus. FIG. 2B is a sectional view taken along b-b' in FIG. 2A. Note that the same reference numerals as in FIGS. 2A and 2B denote the same constituent elements in FIGS. 1A and 1B.

In the radiation detection apparatus, an inductive electromotive force is generated according to the law of electromagnetic induction when an alternating current magnetic field, that is, a fluctuating magnetic flux, penetrates through a closed circuit in the radiation detection apparatus. In addition, the inductive electromotive force is converted into an inductive current by the impedance of the closed circuit. This inductive current is superimposed on an electrical signal detected by the sense amplifier 7. This generates image noise. It is known that the inductive current is proportional to the magnetic flux density of alternating current magnetic field noise and the cross-section area of the closed circuit and is inversely proportional to the impedance of the closed circuit. That is, as the cross-section area of the closed circuit through which alternating current magnetic field noise penetrates decreases and the impedance of the closed circuit increases, image noise is harder to occur.

In the radiation detection apparatus, an inductive electromotive force is generated according to the law of electromagnetic induction when an alternating current magnetic field, that is, a fluctuating magnetic flux, penetrates through a closed circuit in the radiation detection apparatus. This inductive electromotive force is superimposed on an electrical signal detected by the sense amplifier 7. This generates image noise. It is known that the inductive electromotive force is proportional to the magnetic flux density of alternating current magnetic field noise and the cross-section area of the closed circuit. That is, as the cross-section area of the closed circuit through which alternating current magnetic field noise penetrates increases, image noise is generated more.

Referring to FIG. 2B, a closed circuit C2 through which horizontal alternating current magnetic field noise penetrates is indicated by the dotted line. The closed circuit C2 includes a path constituted by the output substrate 11, the gate driver 10, the driving signal line 4, the parasitic capacitor 14, the image signal line 5, the sense amplifier 7, and the readout substrate 8 and a path extending through the support base 12 to which ground of the output circuit 9 and ground of the readout circuit 6 are connected. Therefore, the magnitude of image noise caused by horizontal alternating current magnetic field noise is proportional to the cross-section area indicated by the hatching in FIG. 2B. Note that a portion of the closed circuit C2 which is not indicated by the hatching is a portion existing on the same plane as that of the support base 12 when viewed in cross section. That is, this portion is shown above the support base 12 for the sake of descriptive convenience. In practice, however, the portion is formed on the same plane as that of the support base 12. Therefore, the portion has no or only a small cross-section area in the horizontal direction, and hence no horizontal alternating current magnetic field noise penetrates through it. Even if such noise penetrates through the portion, it has only a slight influence. Note that in the following description, for the same reason, a portion of the closed circuit which is not indicated by the hatching is a portion through which no alternating current magnetic field noise penetrates or a portion having only a slight influence even if such noise penetrates through it.

FIGS. 2A and 2B show a case in which the conductive member 13 does not function as part of the closed circuit because the conductive member 13 does not have the portions 13-1 and 13-2 electrically connected to ground of the readout circuit 6 and ground of the output circuit 9, respectively. On the other hand, for example, even if only the portion 13-1 of the conductive member 13 is connected to ground of the readout circuit 6, the conductive member 13 does not function as part of the closed circuit. In addition, the same applies to a case in which only the portion 13-2 of the conductive member 13 is connected to ground of the output circuit 9. That is, the conductive member 13 does not function as part of the closed circuit unless both the portions 13-1 and 13-2 of the conductive member 13 are connected to grounds.

In contrast to this, in the radiation detection apparatus according to this embodiment, the portion 13-1 of the conductive member 13 is connected to ground of the readout circuit 6, and the portion 13-2 of the conductive member 13 is connected to ground of the output circuit 9. As a result, a closed circuit C1 through which horizontal alternating current magnetic field noise penetrates becomes the one indicated by the dotted line in FIG. 1B. The closed circuit C1 includes a path constituted by the output substrate 11, the gate driver 10, the driving signal line 4, the parasitic capacitor 14, the image signal line 5, the sense amplifier 7, and the readout substrate 8 and the conductive member 13 to which ground of the output circuit 9 and ground of the readout circuit 6 are connected. That is, in this embodiment, the portions 13-1 and 13-2 of the conductive member 13 are electrically connected to ground of the output circuit 9 and ground of the readout circuit 6 to form the closed circuit C1 via the conductive member 13. The closed circuit C1 uses, as part of a path, the conductive member 13 arranged near the driving signal line 4 and the image signal line 5, which has not been used as a path. Obviously, this greatly reduces the cross-section area indicted by the hatching, across which alternating current magnetic field noise interlinks, as compared with the related art. This causes part of an inductive current induced by horizontal alternating current magnetic field noise to flow into the closed circuit C1 with the small cross-section area, thereby greatly reducing image noise.

In addition, the relationship between a distance h between both the driving signal line 4 and the image signal line 5 and the support base 12 and a distance h' between both the driving signal line 4 and the image signal line 5 and the conductive member 13 can be set to satisfy h'<h. With this setting, the cross-section area of the closed circuit C1 formed in this embodiment becomes greatly smaller than that of the conventional closed circuit C2. That is, this reduces an inductive current induced by horizontal alternating current magnetic field noise, thereby effectively reducing image noise.

Consider a conductivity or sheet resistance, an area, a thickness, and the impedance of each member which is calculated from a physical shape such as an aperture ratio when the shape is a mesh. Referring to the support base 12 and the conductive member 13, reducing the impedance of the conductive member 13 to a value smaller than that of the support base 12 can further reduce image noise. This can be considered to be an effect obtained by reducing an inductive current induced in the closed circuit C2 with a large cross-section area and causing an inductive current to flow to the closed circuit C1 with a smaller cross-section area.

Second Embodiment

Figure 3:
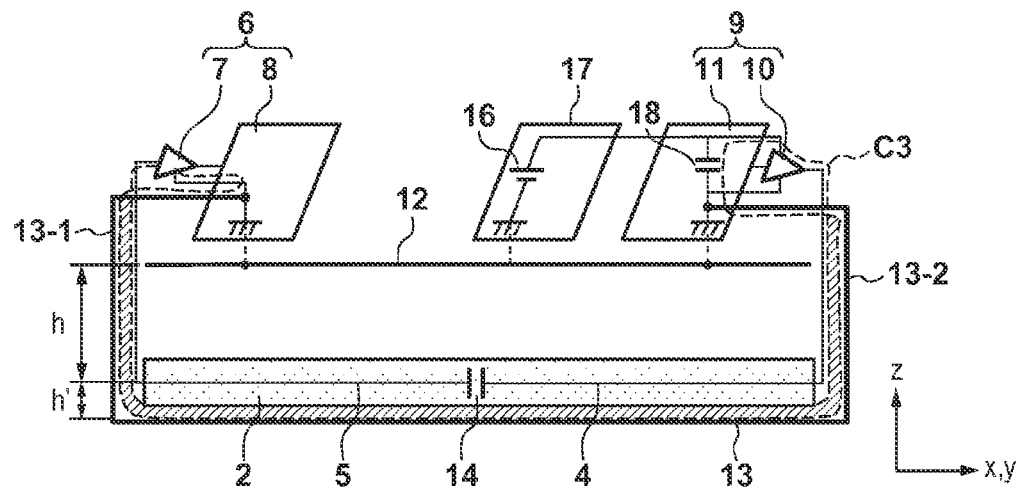
FIG. 3 is a view showing the second example of the structure of the radiation detection apparatus.

FIG. 3 shows the second example of the structure of a radiation detection apparatus. Although FIG. 3 shows only a sectional view of the structure, the basic structure is the same as that shown in FIGS. 1A and 1B. Note that the same reference numerals as in the first embodiment denote the same constituent elements, and a description of them will be omitted.

The radiation detection apparatus according to this embodiment differs from that according to the first embodiment in that a power supply 16 serving as a driving off-bias is applied to a gate driver 10 via a power supply substrate 17. The driving off-bias is a ground potential in the first embodiment. In contrast to this, in the second embodiment, the driving off-bias is set to a potential so as to further increase the potential difference between the driving on-bias and the driving off-bias. This setting is made to prevent a switch element 3 from being turned on when the driving off-bias fluctuates due to various types of noise and to reduce a leakage current in the switch element 3. The radiation detection apparatus according to this embodiment also differs from that according to the first embodiment in that the driving off-bias is connected to ground on an output circuit 9 via a capacitor 18. Note that as the capacitance value of the capacitor 18, for example, a capacitance from 1.3 µF to 1.0 mF is used in consideration of the impedance of the power supply 16 as the driving off-bias.

Referring to FIG. 3, as in the description of the first embodiment, the dotted line indicates a closed circuit C3 through which horizontal alternating current magnetic field noise penetrates. The closed circuit C3 includes a path constituted by an output substrate 11, the gate driver 10, a driving signal line 4, a parasitic capacitor 14, an image signal line 5, a sense amplifier 7, and a readout substrate 8. In addition, in the closed circuit C3, a propagation path is formed from the output circuit 9 to ground of the output circuit 9 via the capacitor 18 with respect to the gate driver 10 serving as a driving off-bias. Portions 13-1 and 13-2 of a conductive member 13 to which ground of the output circuit 9 and ground of the readout circuit 6 are connected electrically connect these paths to the conductive member 13, thereby forming the closed circuit C3 via the conductive member 13.

As described above, as in the first embodiment, it is obvious that in the radiation detection apparatus according to this embodiment, the cross-section area indicted by the hatching, across which alternating current magnetic field noise interlinks, is greatly reduced as compared with the related art. This causes part of an inductive current induced by horizontal alternating current magnetic field noise to flow into the closed circuit C3 with the small cross-section area, thereby greatly reducing image noise.

In addition, the relationship between a distance h between both the driving signal line 4 and the image signal line 5 and a support base 12 and a distance h' between both the driving signal line 4 and the image signal line 5 and the conductive member 13 can be set to satisfy h'<h. With this setting, the cross-section area of the closed circuit C3 formed in this embodiment becomes greatly smaller than that of the conventional closed circuit C2. That is, this further reduces an inductive current induced by horizontal alternating current magnetic field noise, thereby more effectively reducing image noise.

In addition, referring to the support base 12 and the conductive member 13, reducing the impedance of the conductive member 13 to a value smaller than that of the support base 12 can further reduce image noise. This can be considered to be an effect obtained by reducing an inductive current induced in the closed circuit C2 with a large cross-section area and causing an inductive current to flow to the closed circuit C3 with a smaller cross-section area.

Third Embodiment

Figure 4:
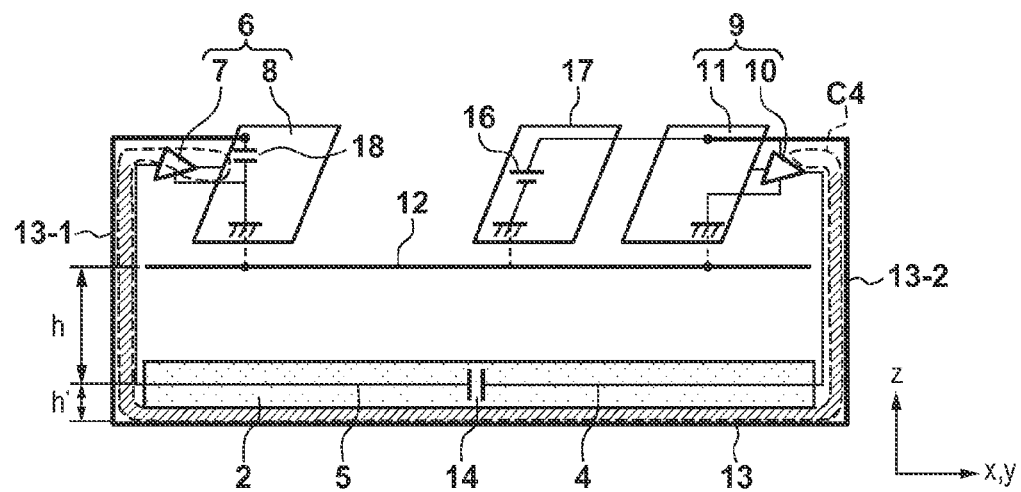
FIG. 4 is a view showing the third example of the structure of the radiation detection apparatus.

FIG. 4 shows the third example of the structure of a radiation detection apparatus. Although FIG. 4 shows only a sectional view of the structure, the basic structure is the same as that shown in FIGS. 1A and 1B. Note that the same reference numerals as in the first and second embodiments denote the same constituent elements, and a description of them will be omitted.

The radiation detection apparatus according to this embodiment differs from those according to the first and second embodiments in that a conductive member 13 is connected to a power supply 16 serving as a driving off-bias on an output circuit 9 via a portion 13-2 of the conductive member 13 to set the conductive member 13 at the same potential as that of the driving off-bias. In addition, the radiation detection apparatus according to this embodiment differs from those according to the first and second embodiments in that a portion 13-1 of the conductive member 13 is connected to ground on a readout circuit 6 via a capacitor 18.

Note that as the capacitance value of the capacitor 18, for example, a capacitance from 1.3 µF to 1.0 mF is used in consideration of the impedance of the power supply 16 as the driving off-bias and the like.

Referring to FIG. 4, as in the description of the first and second embodiments, the dotted line indicates a closed circuit C4 through which horizontal alternating current magnetic field noise penetrates. The closed circuit C4 includes a path constituted by a gate driver 10, a driving signal line 4, a parasitic capacitor 14, an image signal line 5, and a sense amplifier 7. In addition, in the closed circuit C4, a current flowing in or out from the driving off-bias of the gate driver 10 reaches a readout circuit 6 via the portion 13-2 of the conductive member 13 connected on the output circuit 9 and a path constituted by the conductive member 13 and the portion 13-1 of the conductive member 13. This current reaches ground of the readout circuit 6 via the capacitor 18 on the readout circuit 6. The above paths form the closed circuit C4 through which horizontal alternating current magnetic field noise penetrates.

As described above, as in the first and second embodiments, the radiation detection apparatus according to the third embodiment can reduce the cross-section area of the closed circuit through which horizontal alternating current magnetic field noise penetrates. This enables the radiation detection apparatus according to this embodiment to greatly reduce image noise caused by horizontal alternating current magnetic field noise.

Note that in each embodiment described above, although the dotted line indicates the closed circuit, through which horizontal alternating current magnetic field noise penetrates, with respect to only one wiring passing through one driving signal line 4 and one image signal line 5, similar closed circuits exist with respect to the combinations of all the driving signal lines 4 and all the image signal lines 5. Each sense amplifier 7 then detects the integral value of inductive electromotive forces generated when horizontal alternating current magnetic field noise penetrates through all these closed circuits, thus generating image noise. The radiation detection apparatus according to each embodiment described above can reduce image noise caused by alternating current magnetic field noise by reducing the cross-section areas of all the closed circuits corresponding to the combinations of all the driving signal lines 4 and all the image signal lines 5.

Note that since the radiation detection apparatus according to each embodiment described above reduces inductive electromotive force caused by alternating current magnetic field noise by reducing the cross-section area of each closed circuit, it is not necessary to provide any specific control operation for noise reduction at the time of imaging. In addition, since this is the effect of reducing inductive electromotive force by reducing the amount of interlinking magnetic field noise, it is possible to obtain the effect regardless of the amplitude and frequency of alternating current magnetic field noise. As described above, the radiation detection apparatus according to each embodiment described above can reduce the influence of horizontal electromagnetic noise on an obtained image without causing a decrease in imaging speed even in a case in which the frequency or amplitude of alternating current magnetic field noise arriving from the outside is unknown.

Although in the above embodiment, the portion 13-1 of the conductive member 13 is linearly connected to ground at one point of the readout circuit 6, this is not exhaustive. For example, the conductive member 13 may be connected to ground of the readout circuit 6 at a plurality of points or two-dimensionally. Likewise, the portion 13-2 of the conductive member 13 may be connected to ground of the output circuit 9 at a plurality of points or two-dimensionally.

In addition, each embodiment described above can be configured such that at least one of ground of the readout circuit 6 and ground of the output circuit 9 is not electrically connected to the support base 12. This can also be achieved by changing the support base 12 to a material having almost no conductivity, such as CFRP, or a nonconductive material. That is, infinitely increasing (or greatly increasing) the impedance of each closed circuit via the support base 12 can obtain an effect equivalent to greatly increase the impedance of each closed circuit via the conductive member 13. This enables the radiation detection apparatus to further reduce image noise by preventing the formation of a closed circuit via the support base 12.

The following indicates noise amount evaluation results obtained by using the radiation detection apparatus according to each embodiment described above as a cassette-type X-ray digital imaging apparatus used for imaging of the human body in order to verify the effects of each embodiment described above. This evaluation used an X-ray digital imaging apparatus having external dimensions of 384 mm (width)×460 mm (depth)×15 mm (thickness). In addition, a conversion element has about 2800×3400 pixels. The following evaluation result examples each indicate a case in which a sinusoidal current of 25.04 kHz was applied as external horizontal alternating current magnetic field noise by using a 1 m square loop coil.

[Evaluation 1]

In the radiation detection apparatus according to the first embodiment, intervals h and h' in FIGS. 1A and 1B were respectively set to h=about 3 mm and h'=about 500 µm. In addition, the conductive member 13 was made of aluminum, with a thickness of 30 µm. Furthermore, the conductive member 13 was electrically connected to ground with conductive screws at one point on the readout substrate 8 of the readout circuit 6 and one point on the output substrate 11 of the output circuit 9.

In this arrangement, an image noise amount upon imaging was compared with an image noise amount in FIGS. 2A and 2B as a comparative example. Using the radiation detection apparatus according to the first embodiment made it possible to reduce image noise caused by alternating current magnetic field noise from the X direction to 58% and reduce image noise caused by alternating current magnetic field noise from the Y direction to 87% when the image noise amount in FIGS. 2A and 2B was 100%. That is, it was confirmed that the radiation detection apparatus according to the first embodiment was able to obtain the effect of reducing alternating current magnetic field noise from the X and Y directions by 42% and 13%, respectively.

[Evaluation 2]

In this evaluation, unlike evaluation 1, in the radiation detection apparatus according to the first embodiment, at least one of ground of the readout circuit 6 and ground of the output circuit 9 was not electrically connected to the support base 12 by using nonconductive resin screw or the like at the connecting point 15. This is equivalent to greatly increasing the impedance of the closed circuit via the support base 12 as compared with the impedance of the closed circuit via the conductive member 13 by infinitely increasing (or greatly increasing) the impedance of the closed circuit via the support base 12. This arrangement is the same as that shown in FIGS. 1A and 1B in that the closed circuit C1 is formed, but makes all the inductive current flow into the closed circuit C1 via the conductive member 13 without making part of the current flow into the support base 12. It should therefore be able to further increase the cross-section area reducing effect.

In this arrangement, an image noise amount obtained by imaging was compared with an image noise amount in FIGS. 2A and 2B showing a comparative example. As a result, with the above arrangement, when the image noise amount in FIGS. 2A and 2B was 100%, it was able to reduce image noise caused by alternating current magnetic field noise from the X direction to 45% and to reduce image noise caused by alternating current magnetic field noise from the Y direction to 87%. That is, it was confirmed that the radiation detection apparatus according to the first embodiment was able to obtain the effect of reducing image noise caused by alternating current magnetic field noise from the X and Y directions by 55% and 13%, respectively.

[Evaluation 3]

Evaluations were made when the radiation detection apparatus according to the second embodiment was used in an X-ray digital imaging apparatus. In these evaluations, a comparison target was a case in which at least either the portion 13-1 of the conductive member 13 was not electrically connected to the readout circuit 6 or the portion 13-2 of the conductive member 13 was not electrically connected to the output circuit 9, and the radiation detection apparatus having the capacitor 18 mounted on the power supply substrate 17 was used.

As a result, when the comparative example was 100% and the capacitor 18 was 1.3 µF, it was able to reduce image noise caused by alternating current magnetic field noise from the X direction to 90% and to reduce image noise caused by alternating current magnetic field noise from the Y direction to 97%. That is, it was confirmed that the radiation detection apparatus according to the second embodiment was able to obtain the effect of reducing image noise caused by alternating current magnetic field noise from the X and Y directions by 10% and 3%, respectively, as compared with the comparative example.

When the capacitor 18 was 69.3 µF, it was able to reduce image noise caused by alternating current magnetic field noise from the X direction to 75% and to reduce image noise caused by alternating current magnetic field noise from the Y direction to 71%. That is, it was confirmed that the radiation detection apparatus according to the second embodiment was able to obtain the effect of reducing image noise caused by alternating current magnetic field noise from the X and Y directions by 25% and 29%, respectively, as compared with the comparative example.

The present invention can reduce image noise caused by an alternating current magnetic field arriving from the horizontal direction with an unknown frequency and amplitude in a radiation detection apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2014-259270, filed Dec. 22, 2014, and 2015-173201, filed Sep. 2, 2015 which are hereby incorporated by reference herein in their entirety.

What is claimed is:

1. A radiation detection apparatus comprising:
   a planar detection unit, having a two-dimensional array of elements which obtain electrical signals based on radiation, configured to detect radiation upon irradiation;
   a driving circuit which drives switches for causing the elements to output the electrical signals through driving signal lines;
   an obtaining circuit which obtains the electrical signals from the elements through image signal lines in accordance with the switches being driven;
   a support base on which the driving circuit and the obtaining circuit are arranged; and
   a conductive member having parts which are electrically connected to ground of the driving circuit and ground of the obtaining circuit respectively,
   wherein the radiation detection apparatus is formed by stacking the conductive member, the two-dimensional array and the support base when viewed from a radiation source which performs irradiation with radiation, and
   wherein the driving circuit, the obtaining circuit, the driving signal lines, the image signal lines, and the conductive member form a closed circuit.

2. The apparatus according to claim 1, wherein the support base is arranged at a position at which a distance between the support base and the planar detection unit is larger than a distance between the planar detection unit and the conductive member.

3. The apparatus according to claim 1, wherein an impedance of the support base is higher than an impedance of the conductive member.

4. The apparatus according to claim 1, wherein a driving off-bias for turning off the switch is input to the driving circuit, and
   a capacitor is connected between the driving off-bias and ground of the driving circuit, and the conductive member is electrically connected to ground of the driving circuit and ground of the obtaining circuit.

5. The apparatus according to claim 1, wherein a driving off-bias for turning off the switch is input to the driving circuit, and
   the conductive member is connected to the driving off-bias in the driving circuit and is further electrically connected to ground of the obtaining circuit via a capacitor arranged between the driving off-bias and ground of the obtaining circuit.

6. The apparatus according to claim 4, wherein the capacitor has a capacitance from 1.3 µF to 1.0 mF.

7. The apparatus according to claim 1, wherein the support base is arranged behind the planar detection unit when viewed from the radiation source.

8. The apparatus according to claim 1, wherein at least one of ground of the driving circuit and ground of the obtaining circuit is not electrically connected to the support base.

9. The apparatus according to claim 1, wherein the part of the conductive member includes a thin film portion covering the planar detection unit.

10. The apparatus according to claim 1, wherein the conductive member is electrically connected to at least one of ground of the driving circuit and ground of the obtaining circuit at a plurality of positions.

11. A radiation imaging system comprising:
    a radiation detection apparatus;
    an irradiation unit configured to irradiate the radiation detection apparatus with radiation; and
    a forming unit configured to form a radiographic image, the radiation detection apparatus including
- a planar detection unit, having a two-dimensional array of elements which obtain electrical signals based on radiation, configured to detect radiation upon irradiation,
- a driving circuit which drives switches for causing the elements to output the electrical signals through driving signal lines,
- an obtaining circuit which obtains the electrical signals from the elements through image signal lines in accordance with the switches being driven,
- a support base on which the driving circuit and the obtaining circuit are arranged, and
- a conductive member having parts which are electrically connected to ground of the driving circuit and ground of the obtaining circuit, and
- the forming unit forming the radiographic image based on the electrical signals obtained by the obtaining circuit respectively,
- wherein the radiation detection apparatus is formed by stacking the conductive member, the two-dimensional array and the support base when viewed from a radiation source which performs irradiation with radiation, and
- wherein the driving circuit, the obtaining circuit, the driving signal lines, the image signal lines, and the conductive member form a closed circuit.

\* \* \* \* \*